United States Patent
Boyd et al.

(10) Patent No.: US 6,679,596 B2
(45) Date of Patent: Jan. 20, 2004

(54) PLATFORM INCLUDING FLUID MANIFOLD FOR MULTIPLE FLUID EJECTION DEVICES

(75) Inventors: Melissa D Boyd, Corvallis, OR (US); Timothy E Beerling, Corvallis, OR (US); Timothy L Weber, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/194,843

(22) Filed: Jul. 11, 2002

(65) Prior Publication Data

US 2002/0180835 A1 Dec. 5, 2002

Related U.S. Application Data

(63) Continuation of application No. 09/972,648, filed on Oct. 5, 2001, now Pat. No. 6,435,653, which is a continuation of application No. 09/216,606, filed on Dec. 17, 1998, now Pat. No. 6,322,206, which is a continuation-in-part of application No. 08/959,376, filed on Oct. 28, 1997, now Pat. No. 6,123,410.

(51) Int. Cl.[7] .................................................. B41J 2/18
(52) U.S. Cl. .......................................... 347/89; 347/49
(58) Field of Search .............................. 347/49, 65, 71, 347/85, 89

(56) References Cited

U.S. PATENT DOCUMENTS

| | | | | |
|---|---|---|---|---|
| 4,380,770 A | * | 4/1983 | Maruyama | 347/89 |
| 4,917,286 A | | 4/1990 | Pollacek | |
| 5,016,023 A | | 5/1991 | Chan et al. | 347/42 |
| 5,087,930 A | * | 2/1992 | Roy et al. | 347/85 |
| 5,097,275 A | * | 3/1992 | Takita | 347/89 |
| 5,489,930 A | | 2/1996 | Anderson | 347/71 |
| 5,561,448 A | * | 10/1996 | Kaneko et al. | 347/89 |
| 5,565,900 A | | 10/1996 | Cowger et al. | 347/42 |
| 5,808,635 A | | 9/1998 | Kneezel et al. | 347/41 |
| 5,939,206 A | | 8/1999 | Kneezel et al. | 428/480 |
| 6,123,410 A | | 9/2000 | Beerling et al. | 347/42 |
| 6,322,206 B1 | | 11/2001 | Boyd et al. | 347/85 |
| 6,343,857 B1 | | 2/2002 | Cowger | 347/89 |

OTHER PUBLICATIONS

"Precision Flip–Chip Solder Bump Interconnects For Optical Packaging"; William R. Imler et al.; Dec. 1992; IEEE; vol. 15; No. 6; pp. 977–982.

"Use Of AuSn Solder Bumps In Three–Dimensional Passive Aligned Packaging of LD/PD Arrays On Si Optical Benches"; Masataka Itoh, et al; 1996; IEEE; pp. 1–7.

"Active Atmosphere Solder Self–Alignment And Bonding Of Opitcal Components"; R.D. Eshmukh et al.; vol. 16; No. 2; Second Quarter 1993; International Journal Of Microcircuits And Electronics Packaging; pp. 97–107.

"Multilayered Focal Plane Structures With Self–Aligning Detector Assembly"; David E. Ludwig; SPIE; vol. 2745; 1996; pp. 149–158.

"Experimental Results On The Self–Alignment Process Using Au/Sn Metallurgy And On The Growth Of The S–Phase During The Reflow"; Christine Kallmayer, et al; 1995; Semiconductor Technology Center, Inc–Symposium; pp. 225–237.

"Photolithography In Anisotropically Etched Grooves"; S. Linder, et al.; 1996; IEEE; pp. 38–43.

* cited by examiner

*Primary Examiner*—Stephen D. Meier
*Assistant Examiner*—Julian D. Huffman

(57) ABSTRACT

A fluid ejection assembly includes a platform having a fluid inlet, a fluid outlet, a plurality of fluid feed slots, and a fluid manifold defined therein, and a plurality of fluid ejection devices each mounted on the platform and including an array of drop ejecting elements and a fluid refill slot communicating with the array of drop ejecting elements. The fluid refill slot of each of the fluid ejection devices communicates with at least one of the fluid feed slots of the platform, and the fluid manifold of the platform fluidically couples each of the fluid feed slots with the fluid inlet and the fluid outlet of the platform.

17 Claims, 10 Drawing Sheets

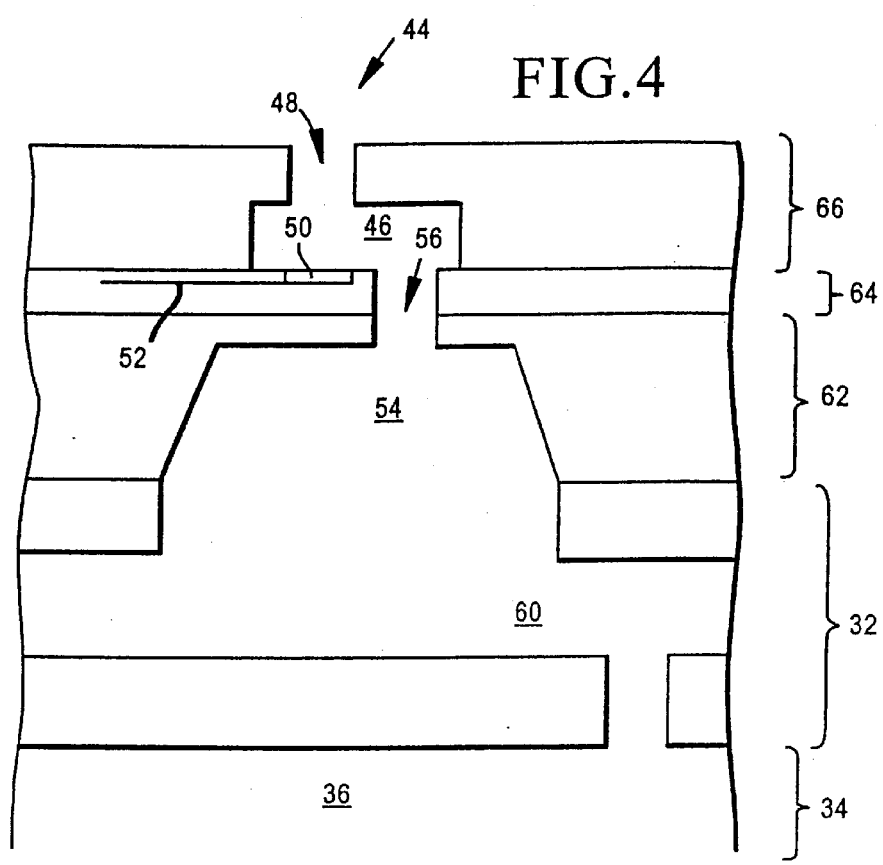
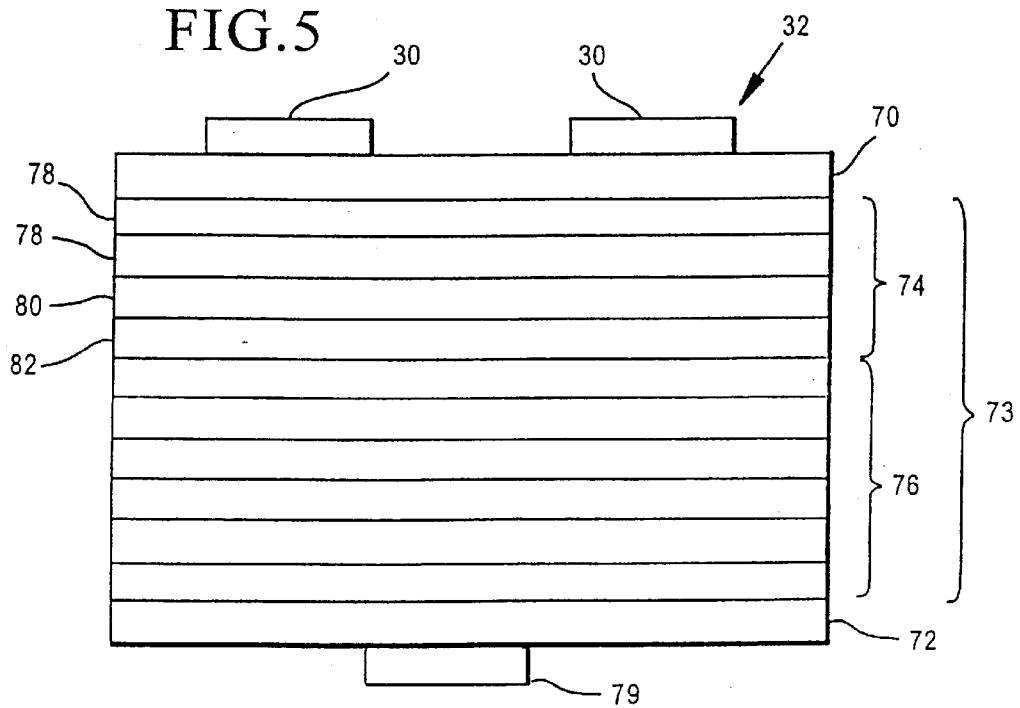

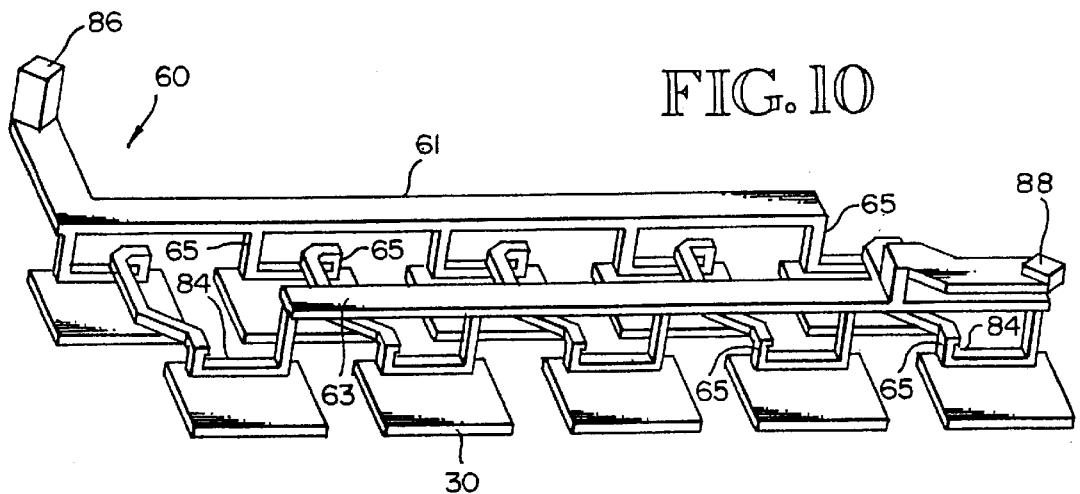
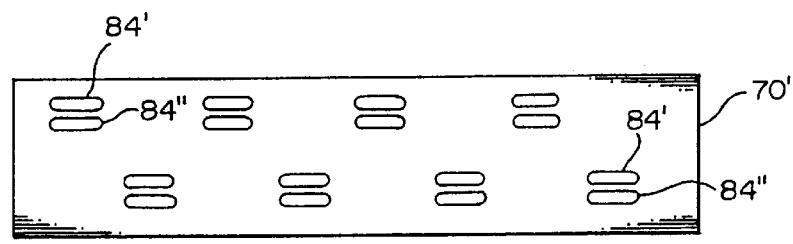
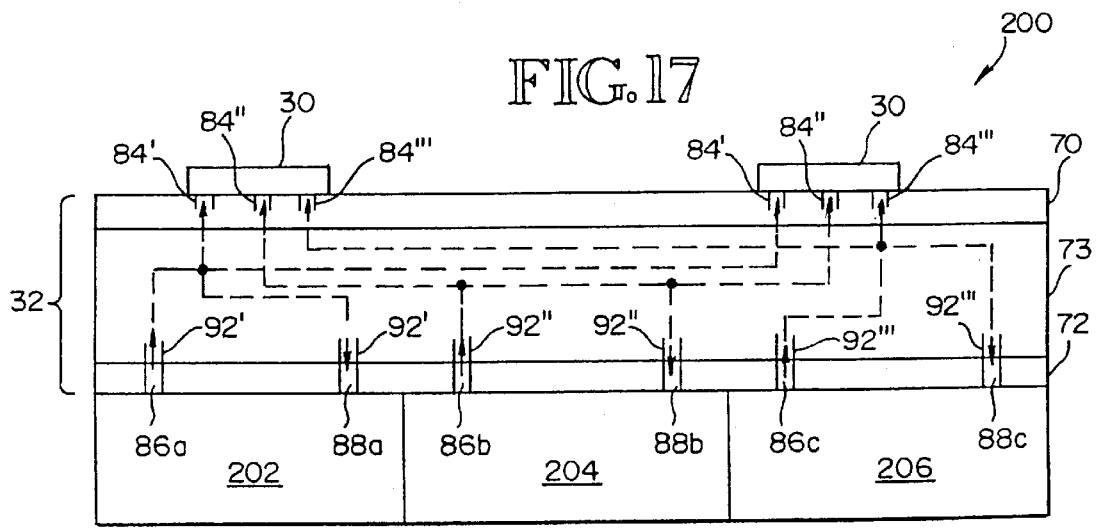

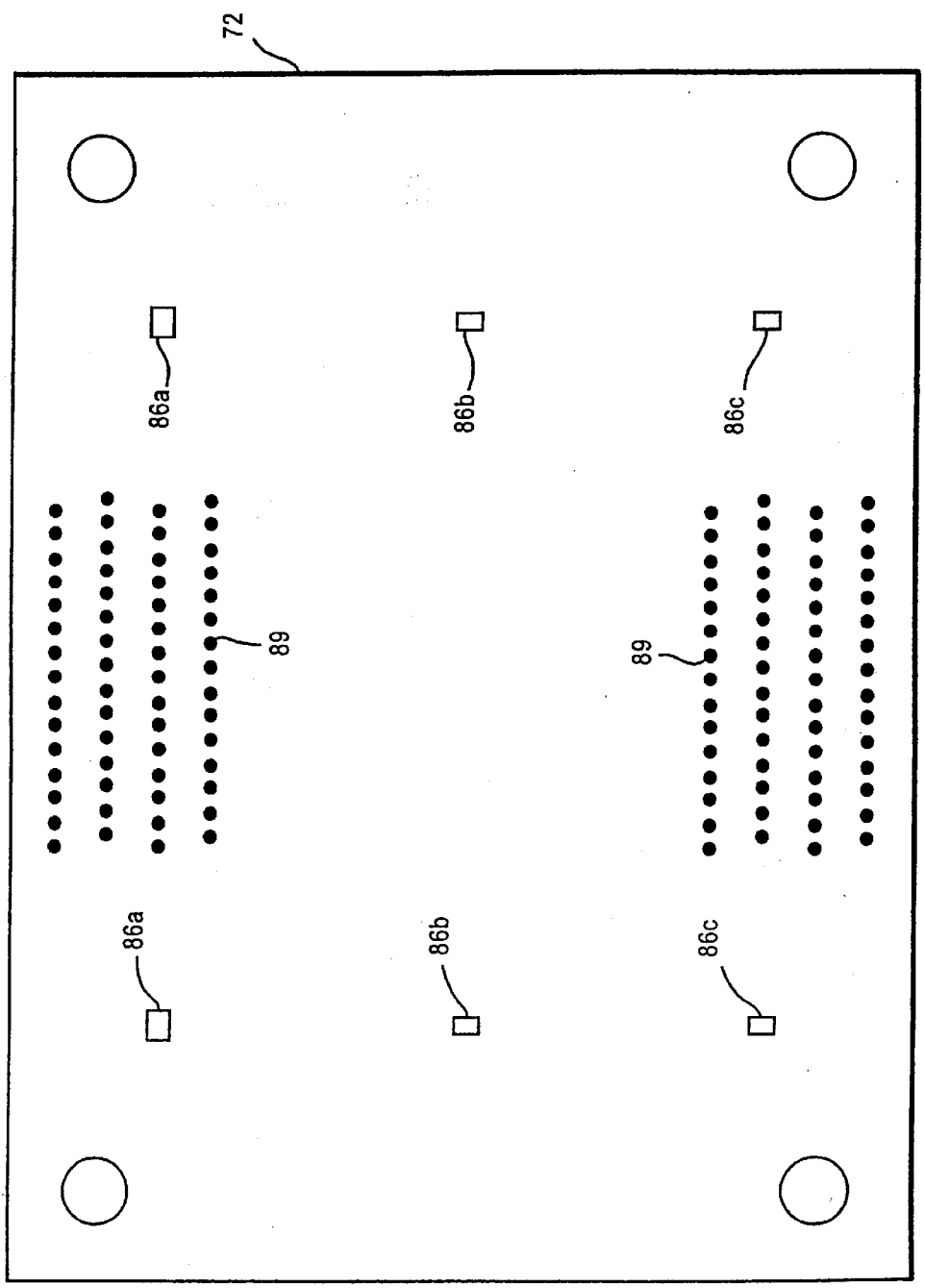

PLATFORM INCLUDING FLUID MANIFOLD FOR MULTIPLE FLUID EJECTION DEVICES

CROSS REFERENCE TO RELATED APPLICATION(S)

This is a Continuation of U.S. patent application Ser. No. 09/972,648 now U.S. Pat. No. 6,435,653, filed on Oct. 5, 2001, which is a Continuation of U.S. patent application Ser. No. 09/216,606 now U.S. Pat. No. 6,322,206, filed on Dec. 17, 1998, which is a Continuation-in-Part of U.S. patent application Ser. No. 08/959,376, filed on Oct. 28, 1997, now U.S. Pat. No. 6,123,410, each assigned to the assignee of the present invention and incorporated herein by reference.

BACKGROUND OF THE INVENTION

This invention relates generally to inkjet printhead construction, and more particularly, to wide-array inkjet printhead construction.

There are known and available commercial printing devices such as computer printers, graphics plotters and facsimile machines which employ inkjet technology, such as an inkjet pen. An inkjet pen typically includes an ink reservoir and an array of inkjet printing elements, referred to as nozzles. The array of printing elements is formed on a printhead. Each printing element includes a nozzle chamber, a firing resistor and a nozzle opening. Ink is stored in the ink reservoir and passively loaded into respective firing chambers of the printhead via an ink refill channel and ink feed channels. Capillary action moves the ink from the reservoir through the refill channel and ink feed channels into the respective firing chambers. Conventionally, the printing elements are formed on a common substrate.

For a given printing element to eject ink a drive signal is output to such element's firing resistor. Printer control circuitry generates control signals which in turn generate drive signals for respective firing resistors. An activated firing resistor heats the surrounding ink within the nozzle chamber causing an expanding vapor bubble to form. The bubble forces ink from the nozzle chamber out the nozzle opening.

A nozzle plate adjacent to the barrier layer defines the nozzle openings. The geometry of the nozzle chamber, ink feed channel and nozzle opening defines how quickly a corresponding nozzle chamber is refilled after firing. To achieve high quality printing ink drops or dots are accurately placed at desired locations at designed resolutions. It is known to print at resolutions of 300 dots per inch and 600 dots per inch. Higher resolution also are being sought There are scanning-type inkjet pens and non-scanning type inkjet pens. A scanning-type inkjet pen includes a printhead having approximately 100–200 printing elements. A non-scanning type inkjet pen includes a wide-array or page-wide-array printhead. A page-wide-array printhead includes more than 5,000 nozzles extending across a page-width. Such printhead is controlled to print one or more lines at a time.

In fabricating wide-array printheads the size of the printhead and the number of nozzles introduce more opportunity for error. Specifically, as the number of nozzles on a substrate increases it becomes more difficult to obtain a desired processing yield during fabrication. Further, it is more difficult to obtain properly sized substrates of the desired material properties as the desired size of the substrate increases.

In the related matter, cross-referenced above, a scalable wide-array printhead structure is described in which multiple inkjet printhead dies are mounted to a carrier substrate. One of the challenges in forming a wide array printhead with multiple printhead dies is the number of interconnections which occur. Many electrical interconnections are needed. In addition, many ink connections are required to deliver the inks. In a three-color, four inch, wide-array printhead having 34 printhead dies, for example, there are at least 102 fluid interconnections (i.e., 3×34=102).

SUMMARY OF THE INVENTION

One aspect of the present invention provides a fluid ejection assembly. The fluid ejection assembly includes a platform having a fluid inlet, a fluid outlet, a plurality of fluid feed slots, and a fluid manifold defined therein, and a plurality of fluid ejection devices each mounted on the platform and including an array of drop ejecting elements and a fluid refill slot communicating with the array of drop ejecting elements. The fluid refill slot of each of the fluid ejection devices communicates with at least one of the fluid feed slots of the platform, and the fluid manifold of the platform fluidically couples each of the fluid feed slots with the fluid inlet and the fluid outlet of the platform.

BRIEF DESCRIPTION OF THE DRAWINGS

FIG. 4 is a partial cross-sectional view showing an ink flow path from a reservoir to an inkjet nozzle according to the printing system of FIG. 1;

FIG. 5 is a diagram of multiple layers of a ceramic carrier substrate of FIG. 4;

FIG. 10 is a diagram of a manifold channel and multiple printhead dies according to an embodiment of this invention;

FIG. 11 is a planar view of a top layer of the ceramic substrate of FIG. 5 according to a 2-color embodiment of substrate of FIG. 4;

FIG. 12 is a planar view of a layer of the ceramic substrate of FIG. 5 according to a 3-color embodiment;

FIG. 17 is a diagram of a 3-color inkjet pen according to an embodiment of this invention.

DESCRIPTION OF SPECIFIC EMBODIMENTS

Printing System

Figure 1:
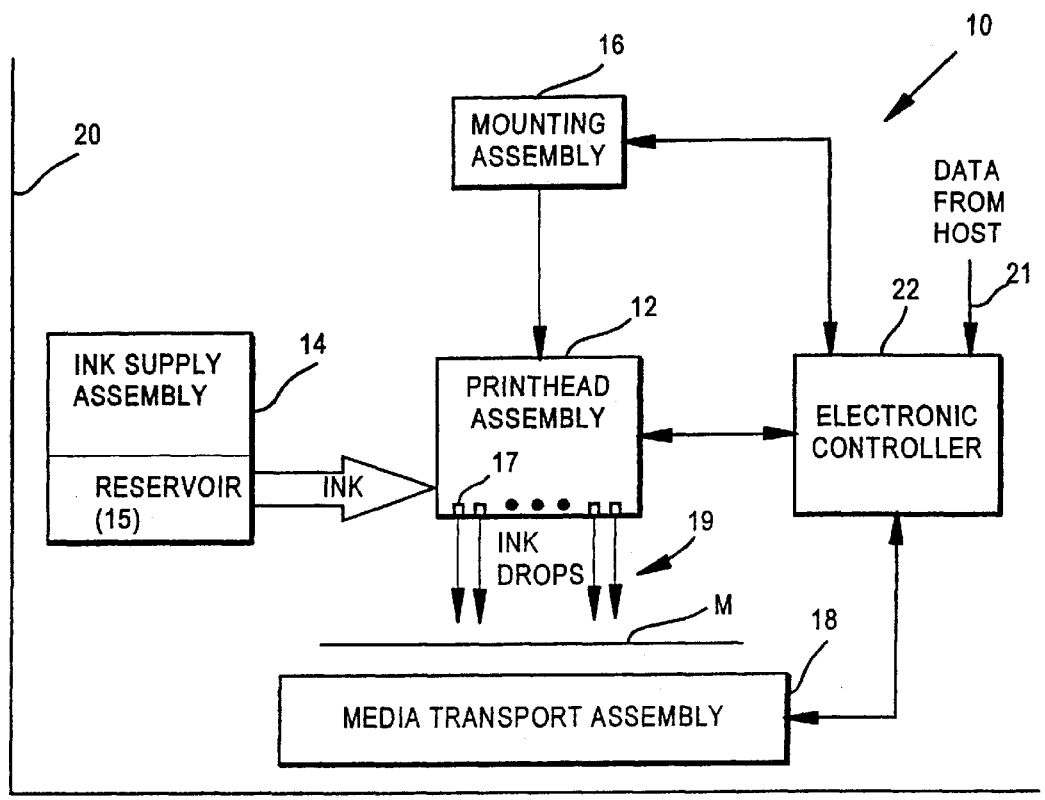
FIG. 1 is a block diagram of an inkjet printing system according to an embodiment of this invention.

Referring to FIG. 1, a thermal inkjet printing system 10 includes an inkjet printhead assembly 12, an ink supply assembly 14, a mounting assembly 16, a media transport assembly 18, a housing 20 and an electronic controller 22. The inkjet printhead assembly 12 is formed according to an embodiment of this invention, and includes one or more printheads having a plurality of inkjet nozzles 17 which eject ink onto a media sheet M. The printhead assembly 12 receives ink from the ink supply assembly 14. The ink supply assembly 14 includes a reservoir 15 for storing the ink. The ink supply assembly 14 and printhead assembly 12 form either a one-way ink delivery system or a recirculating ink delivery system. For the recirculating ink delivery system, ink flows from the reservoir into the printhead assembly. Some of the ink travels into printhead dies and nozzle chambers, while other portions of ink return to the ink reservoir.

In some embodiments the ink supply assembly 14 and inkjet printhead assembly 16 are housed together in an inkjet pen or cartridge. In other embodiments the ink supply assembly 14 is separate from the inkjet printhead assembly 12 and feeds ink to the printhead assembly through an interface connection, such as a supply tube. For either approach the ink supply may be removed, replaced and/or refilled. For example, in an inkjet pen having an internal reservoir, the pen may be disassembled and the internal reservoir removed. A new, filled reservoir then is placed within the pen, and the pen reassembled for re-use. Alternatively, the prior reservoir may be refilled and reinstalled in the pen or filled in place without removal from the pen (an in some embodiments without even disassembling the pen). In some embodiments there is a local reservoir within the pen along with a larger reservoir located separate from the pen. The separate reservoir serves to refill the local reservoir. In various embodiments, the separate reservoir and/or the local reservoir may be removed, replaced and/or refilled.

The inkjet printhead assembly 12 is mounted relative to the housing 20 to define a print zone 19 adjacent to the printhead nozzles 17 in an area which is to receive the media sheet M. The media sheet M is moved into the print zone 19 by the media transport assembly 18. The mounting assembly 16 positions the printhead assembly 12 relative to the media transport assembly 18. For a scanning type inkjet printhead assembly, the mounting assembly 16 includes a carriage for moving the printhead assembly 12 relative to a media transport path to scan the printhead assembly 12 relative to the media sheet. For a non-scanning type inkjet printhead assembly, the mounting assembly 16 fixes the inkjet printhead assembly 12 at a prescribed position along the media transport path.

The electronic controller 22 receives documents, files or other data 21 to be printed from a host system, such as a computer. Typically, a print job is sent to the inkjet printing system 10 along an electronic, infrared, optical or other information transfer path. The print job includes data and one or more commands or command parameters. The electronic controller 22 includes memory for temporarily storing the data. The electronic controller 22 provides timing control for firing respective inkjet nozzles 17 to define a pattern of ejected ink drops which form characters, symbols or other graphics on the media sheet M. The pattern is determined by the print job data and print job commands or command parameters.

Upon activation of a given firing resistor 50, ink within the surrounding nozzle chamber 46 is ejected through the nozzle opening 48 onto a media sheet M. The electronic controller 22 selects which firing resistors 50 are active at a given time by activating corresponding drive signals to heat the corresponding firing resistors 50. In one embodiment logic circuits and drive circuits forming a portion of the controller 22 are mounted to the substrate 32 of the printhead assembly 12. In an alternative embodiment logic circuitry and drive circuitry are located off the printhead assembly 12.

Figure 2:
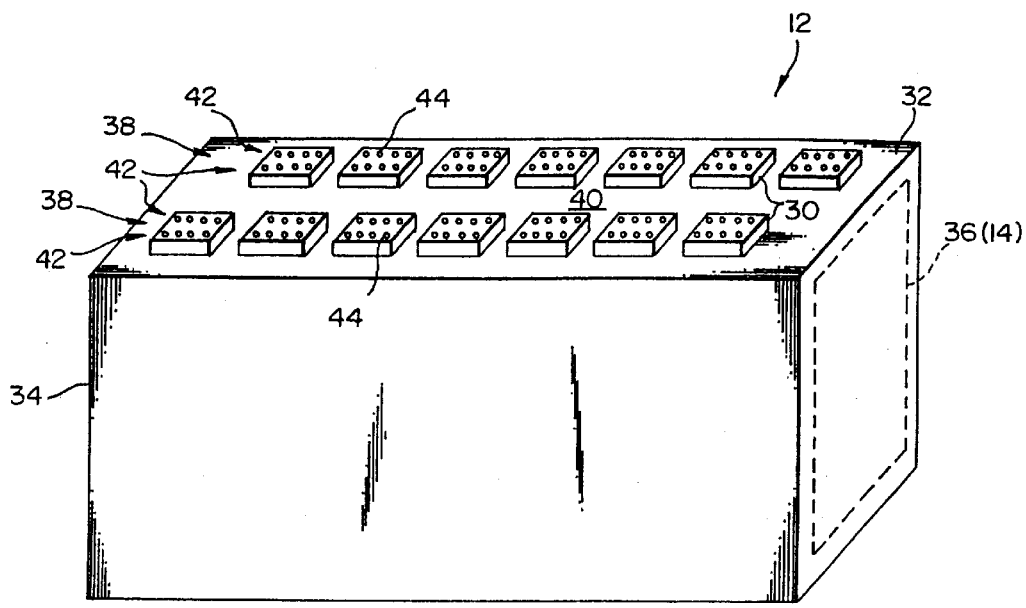
FIG. 2 is a perspective view of an inkjet pen according to an embodiment of this invention.

Referring to FIG. 2, according to a preferred embodiment the printhead assembly 12 includes a plurality of inkjet printhead dies 30 mounted to a multilayered ceramic carrier substrate 32. Illustrated is a pagewide array inkjet pen. The substrate 32 is affixed to a pen body 34. Within the pen body 34 is a reservoir 36 which serves as, or is part of the ink supply assembly 14. The printhead assembly 12 may span a nominal page width or a shorter or longer width, and may be of the scanning type or non-scanning type. In various embodiments, as described above, the reservoir is a replaceable or refillable reservoir. In one embodiment the reservoir is coupled to an external reservoir which supplies the local reservoir. In another embodiment the reservoir is non-refillable.

Figure 3:
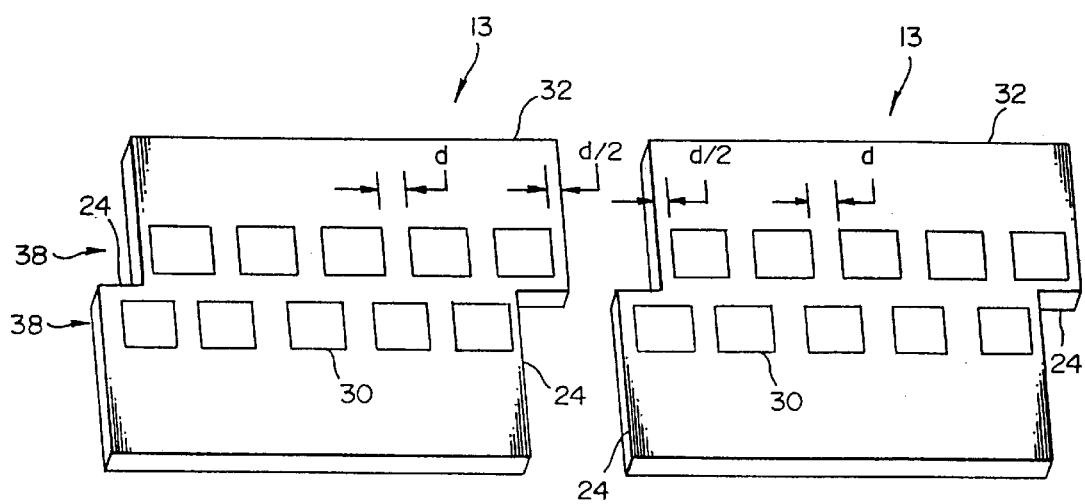
FIG. 3 is a perspective view of a portion of an inkjet printhead assembly according to an embodiment of this invention.
Figure 6:
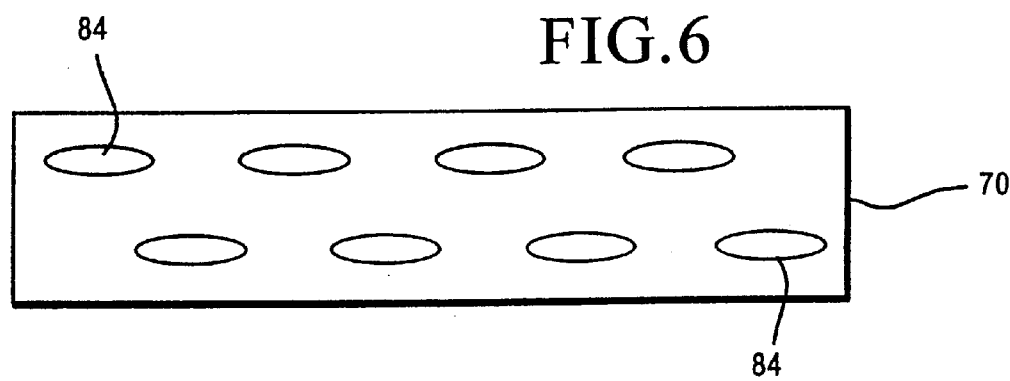
FIG. 6 is a planar view of a top layer of the ceramic substrate of FIG. 5.

Referring to FIG. 3, the printhead assembly 12 may be formed by a plurality of printhead subassemblies 13. Each subassembly 13 includes a plurality of inkjet printhead dies 30 mounted to a multilayered ceramic carrier substrate 32. The substrate 32 has stairstep edges 24 allowing the subassemblies 13 to be mounted end to end to form the printhead assembly 12. Each subassembly 13 has multiple rows 38 of printhead dies 30. Such rows 38 are staggerred to the stairstep design of the carrier substrate 32. In a preferred embodiment the printhead dies are spaced at a distance d. The printhead dies closest to the edges 24 are spaced a distance d/2 from the edge 24. When the carrier substrates are mounted end to end, continuous rows of dies 30 are formed with each die evenly spaced (e.g., at a spacing distance 'd').

Printhead Dies

The printhead dies 30 are aligned in one or more rows 38 on a first surface 40 of the carrier substrate 32. Referring to FIG. 2, each one of the printhead dies 30 includes a plurality of rows 42 of inkjet printing elements 44, also referred to as nozzles. Each printhead die 30 includes an array of printing elements 44. Referring to FIG. 4, each printing element 44 includes a nozzle chamber 46 having a nozzle opening 48. A firing resistor 50 is located within the nozzle chamber 46. Wiring lines 52 electrically couple the firing resistor 50 to a drive signal and ground. Each printhead die 30 also includes a refill channel 54. Ink flows from the internal reservoir 36 through one or more carrier substrate refill channels 60 to the refill channels 54 of the printhead dies 30. Ink flows through each printhead refill channel 54 into the printhead nozzle chambers 46 via ink feed channels 56.

In one embodiment one or more of the printhead dies 30 is a fully integrated thermal inkjet printhead formed by a silicon die 62, a thin film structure 64 and an orifice layer 66. Glass or a stable polymer are used in place of the silicon in alternative embodiments. The thin film structure 64 is formed by one or more passivation or insulation layers of silicon dioxide, silicon carbide, silicon nitride, tantalum, poly silicon glass, or another suitable material. The thin film structure also includes a conductive layer for defining the firing resistor 50 and the wiring lines 52. The conductive layer is formed by aluminum, gold, tantalum, tantalum-aluminum or other metal or metal alloy.

Carrier Substrate

The carrier substrate 32 in a preferred embodiment is made of a multilayered ceramic material, such as used in forming hybrid multichip modules. The substrate 32 preferably has a coefficient of thermal expansion approximating that of silicon, is able to receive solder and interconnect layers, and is able to receive mounting of integrated circuits. Referring to FIG. 5, the substrate 32 includes a top layer 70 upon which the printhead dies 30 are mounted, a bottom layer 72 upon which an integrated circuit 79 may be mounted, and several intermediary layers 73. The intermediary layers 73 may be allocated into one set 74 for electrical interconnection and another set 76 for ink manifold distribution. The electrical interconnection layers include one or more signal distribution layers 78, a power plane layer 80, and a ground plane layer 82 as well as interconnection to the printheads and integrated circuits. Even the electrical interconnection layers, however, may include slots for allowing ink to move vertically from one layer to another.

In a preferred embodiment, electrical interconnection layers and manifold layers are embodied in common layers. Thus, many of the intermediary layers 73 serve to provide wiring lines and to define portions of one or more ink manifold channels. The ink manifold channels 60 (see FIG. 4) receive ink from the reservoir 36. The ink flows through the manifold channels to respective slots 54 (see FIG. 4) for each printhead die 30. For multi-colored printhead assemblies, there are isolated manifold channels for each ink color and separate output slots for dies receiving a respective color.

Each of the ceramic layers 70–73 has a thickness ranging from 0.004 inches to 0.030 inches. The layers 73 which include circuit patterns include conductive vias which pierce the layers 73 to form electrical interconnects between circuits. In one fabrication methodology, circuit patterns are formed in layers of unfired tape (referred to as a green sheet) using a screen printing process. The green sheet is made of ceramic particles in a polymer binder. Alumina preferably is used for the particles, although other oxides or various glass/ceramic blends also may be used. The green tape has the texture of flexible vinyl.

Each green sheet layer receives conductor lines and other metallization patterns as needed to define the signal distribution planes 78, the power plane 80, and the ground plane 82. Such lines and patterns are formed with a refractory metal, such as tungsten, by screen printing on the corresponding green sheet layer. Electrical interconnects are made from one layer to the next through via holes punched out from the green sheet and filled in, for example, with a tungsten paste.

The ink channels 60 are formed by punching holes and cavities of desired size and shape through the alumina tape. Once each layer has received the desired metallization, vias and openings, the layers 70–73 are stacked in the desired configuration and laminated under pressure. The substrate then is shaped to a desired outer dimension size allotting for shrinkage during a subsequent processing. Next, the ceramic and metallization materials are cosintered at approximately 1600 C., creating a monolithic structure having a three dimensional wiring system and internal ink manifold. Metal parts such as I/O pins and seal rings are attached with a molten brazing process, such as a silver-copper eutectic brazing or a pure silver brazing. Exposed metal and metallization surfaces then are covered in a plating process, such as a nickel plating process and a finish plating, such as a gold plating with nickel undercoating. The finish plating provides a surface which may receive solder or wire bonding material allowing electrical connections to the substrate 32. The top layer 70 typically is metallized in preparation for surface mounting the printhead dies 30.

Figure 7:
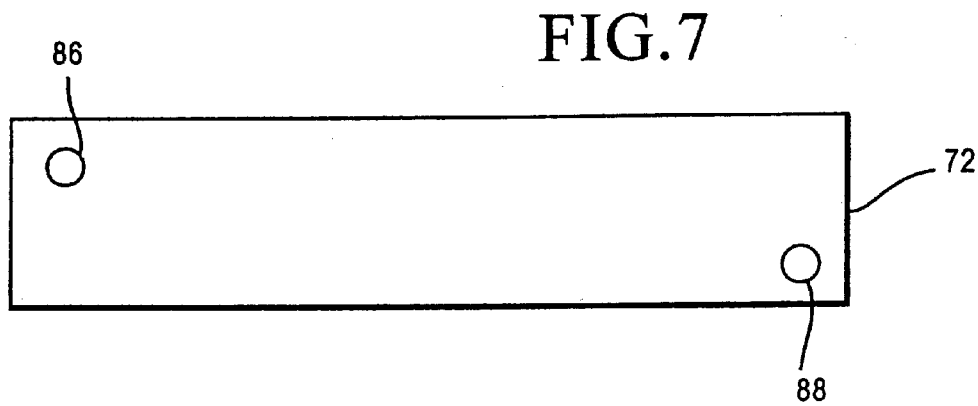
FIG. 7 is a planar view of a bottom layer of the ceramic substrate of FIG. 5.

Embodiments of the ink manifold now are described with respect to FIGS. 6–17. FIGS. 6–9 refer to a single color ink manifold. The top layer 70 of the ceramic substrate 32 includes an ink feed slot 84 for each printhead die 30. Referring to FIG. 7, the bottom layer 72 includes at least one inlet opening 86 for receiving ink from the reservoir 36. In some embodiments the ink cycles through the substrate 32 back to the reservoir 36. In such an embodiment the bottom layer 72 also includes at least one outlet opening 88. For a non-cycling embodiment there is no need for an ink outlet opening at the bottom layer 72. The flow path for the ink through the substrate 32 between the top layer 70 and bottom layer 72 is defined primarily by the set of layers 73.

Figure 8:
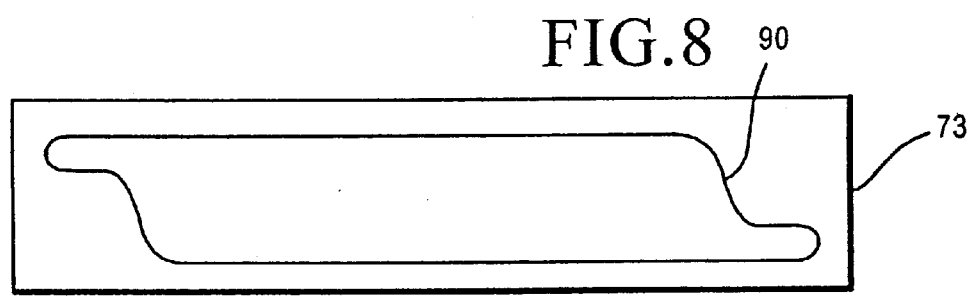
FIG. 8 is a planar view of a manifold layer of the ceramic substrate of FIG. 5.
Figure 9:
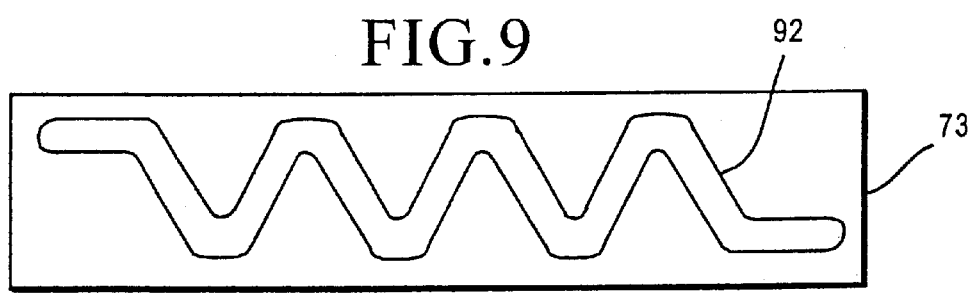
FIG. 9 is a planar view of a manifold layer of the ceramic substrate of FIG. 5 according to an alternative embodiment of this invention.

In one embodiment, a large cavity 90 as shown in FIG. 8 serves as the manifold for fluidly coupling the inlet openings 86 to the outlet opening 88 and the ink slots 84. In another embodiment a serpentine path 92 as shown in FIG. 9 serves as the manifold for fluidly coupling the inlet openings 86 to the outlet opening 88 and the ink slots 84. It is desired that the flow path 90 or 92 minimize flow resistance, avoid bubble traps and achieve a desired ink flow rate. The cavity 90 or the serpentine path 92 may be formed in one or more layers 73. Vertical openings are formed in the intervening layers to complete a channel from the top layer 70 to the bottom layer 72.

In another embodiment, the manifold channels 60 are formed by slots in the various layers 73. When the layers 73 are stacked a three-dimensional channel 60 is formed having a desired shape and path. A given layer 73 may include ink slots along with electrical interconnection vias or wiring lines. FIG. 10 shows an exemplary manifold channel 60. For purposes of illustration the channel 60 is shown without the defining walls of the forming layers 73. Ink flows from an inlet opening 86 through the channel 60 to a return outlet opening 88 and to several ink feed slots 84 adjacent respective printhead dies 30. In the embodiment illustrated there are two major trunks 61, 63 of the manifold channel 60. One trunk feeds the other. Each trunk 61, 63 serves one or more rows 38 of printhead dies 30. Subchannels 65 extend to and from a trunk to a corresponding feed slot 84.

For printhead dies 30 which concurrently handle multiple colors of ink, there are separate slots in the die 30 for each color of ink. Such slot is connected to inkjet nozzles which eject ink of the same color, and is isolated from nozzles which eject ink of different color. For such an embodiment the ceramic substrate 32 includes corresponding slots 84 in the top layer 70. FIG. 11 shows an embodiment of a top layer 70' with slots 84', 84" for each die 30. Slot 84' handles ink of one color. Slot 84" handles ink of another color. The bottom layer includes an inlet opening and an outlet opening for each color ink (in similar manner as shown for a single color ink system in FIG. 7). The inlet opening and outlet opening for a given color are coupled to a reservoir of ink for such color.

Figure 13:
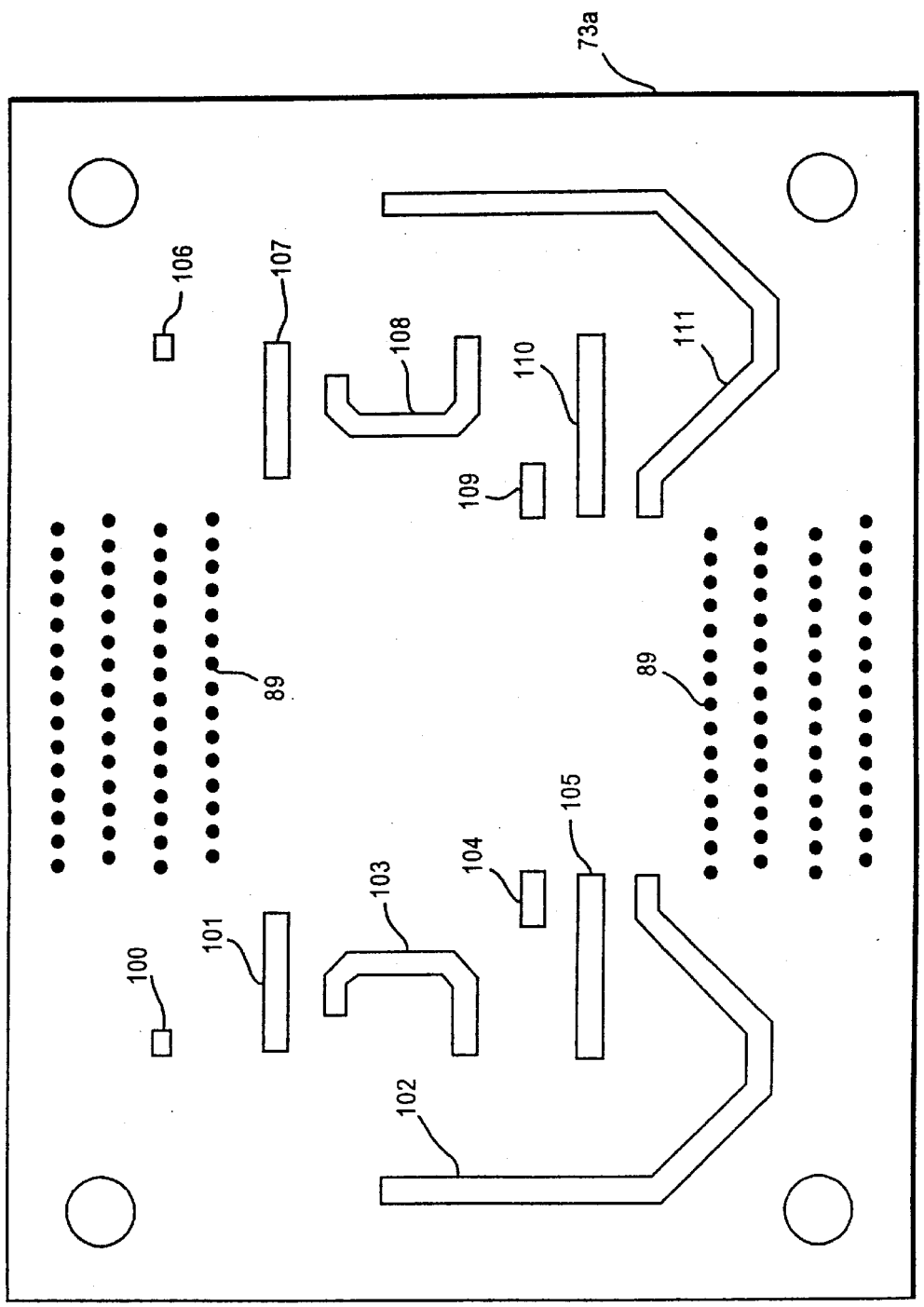
FIG. 13 is a planar view of another layer of the ceramic substrate of FIG. 5 according to a 3-color embodiment.
Figure 14:
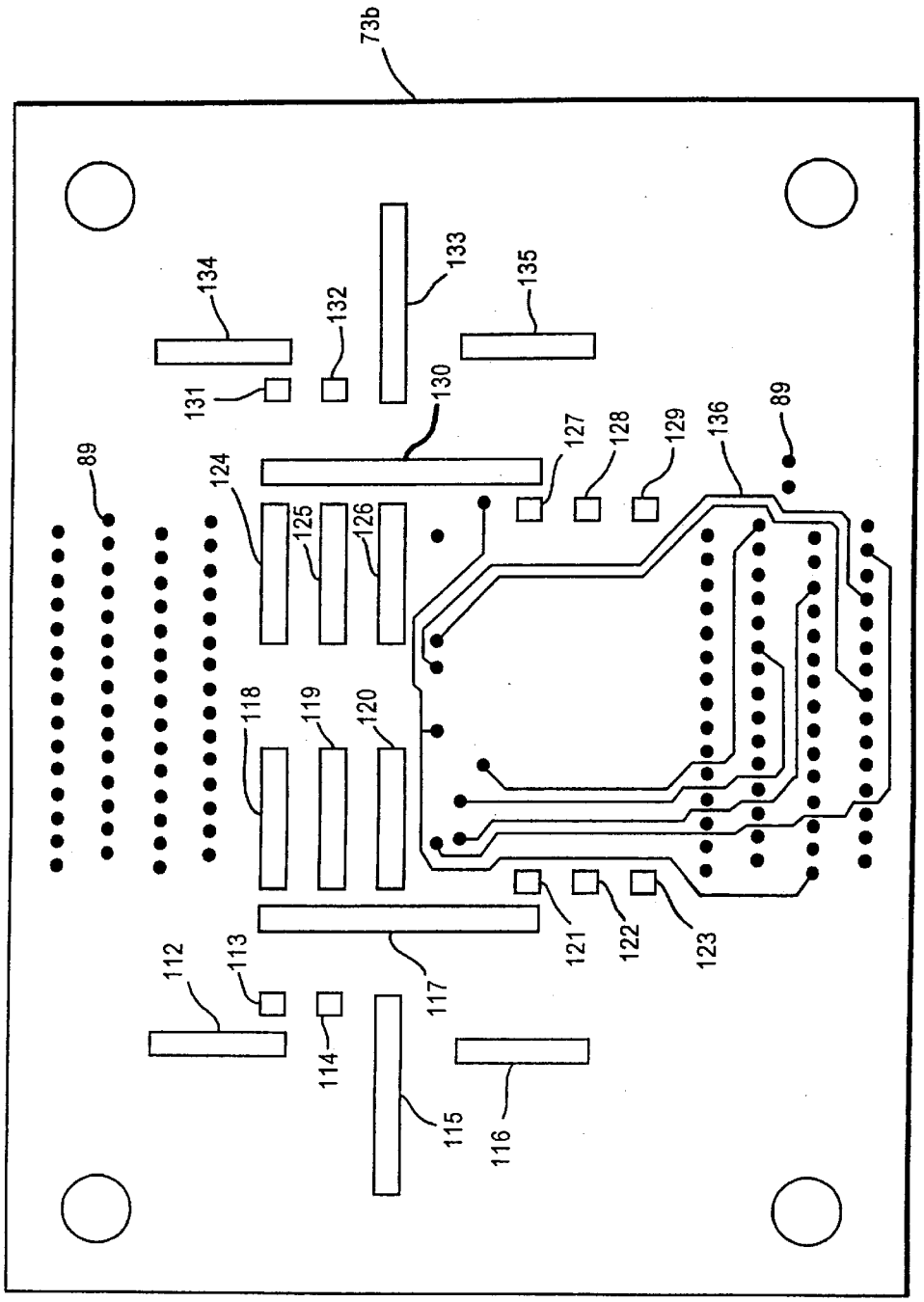
FIG. 14 is a planar view of another layer of the ceramic substrate of FIG. 5 according to a 3-color embodiment.
Figure 15:
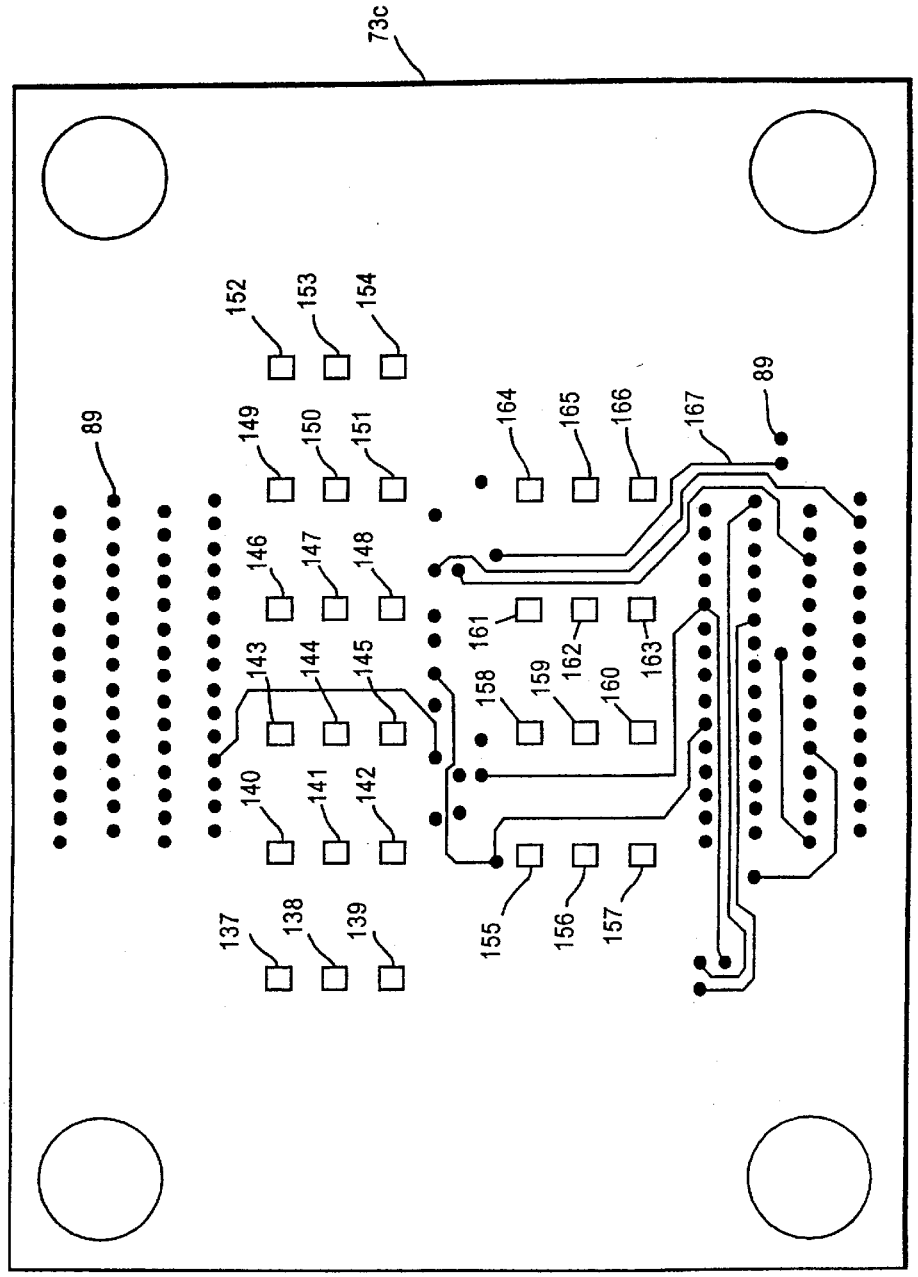
FIG. 15 is a planar view of another layer of the ceramic substrate of FIG. 5 according to a 3-color embodiment.
Figure 16:
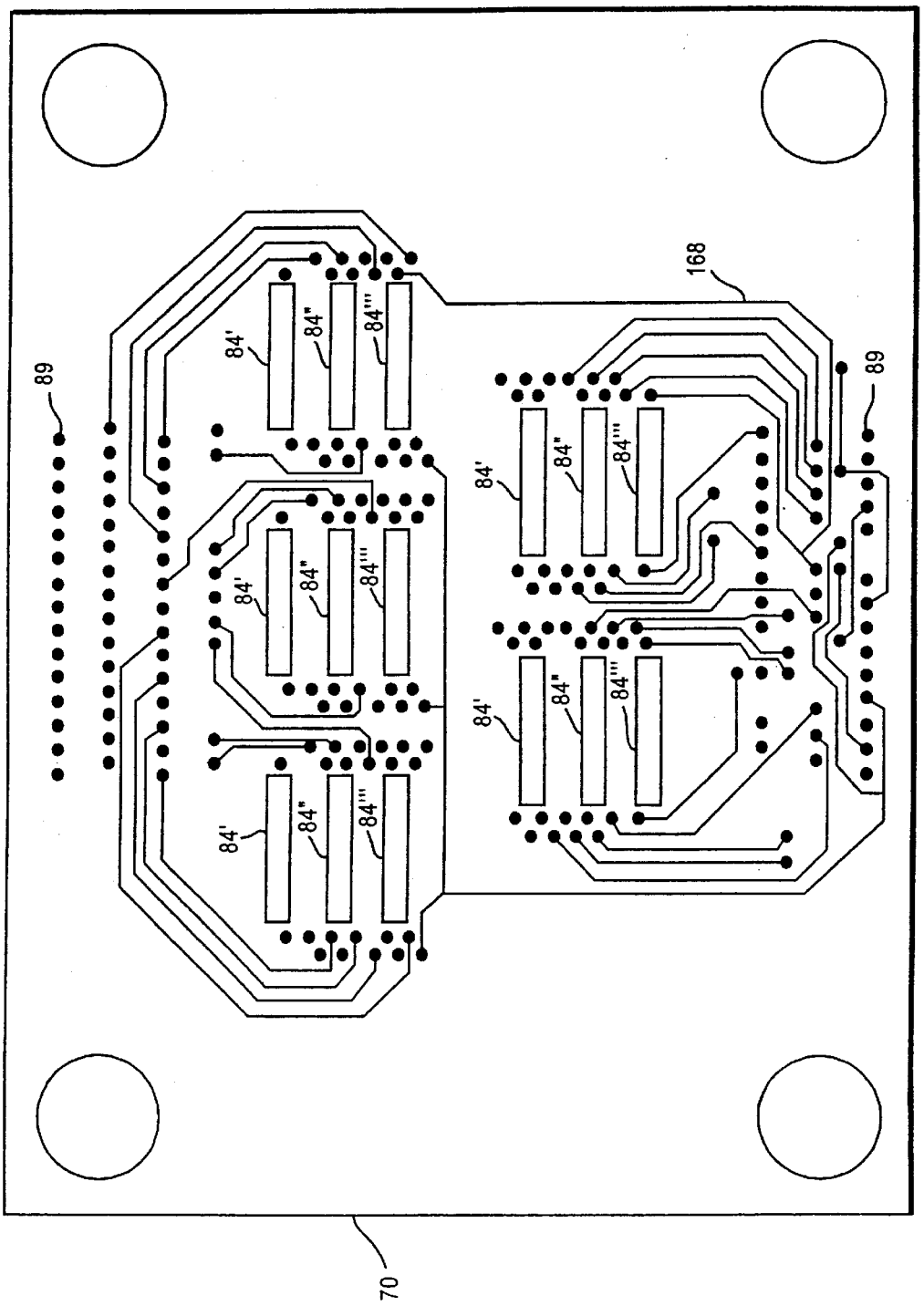
FIG. 16 is a planar view of another layer of the ceramic substrate of FIG. 5 according to a 3-color embodiment.

FIGS. 12–16 show respective layers forming a substrate 32 for a three color printing system. Referring to FIG. 12, layer 72 includes three respective inlet openings 86a–c, one for each color of ink and three respective outlet openings 88a–c, one for each, color of ink. Also shown are a plurality of vias 89 for electrical interconnection. Referring to FIG. 13, a layer 73a for being mounted adjacent to layer 72, includes a plurality of slots 100–111 and the vias 89. Referring to FIG. 14, a layer 73b for being mounted adjacent to layer 73a (opposite layer 72), includes a plurality of slots 112–135, the vias 89 and several wiring lines 136. Referring to FIG. 15, a layer 73c for being mounted adjacent to layer 73b (opposite layer 73a), includes a plurality of slots 137–166, the vias 89 and several wiring lines 167. Referring to FIG. 16, a layer 70 for being mounted adjacent to layer 73c (opposite layer 73b), includes a plurality of slots 84', 84", and 84'", the vias 89 and several wiring lines 168. Each slot 84' corresponds to a feed slot for feeding one color of ink. Each slot 84" corresponds to a feed slot for feeding a second color of ink. Each slot 84'" corresponds to a feed slot for feeding a third color of ink. The slots 84 are arranged in groups of three slots 84', 84" and 84'". A given printhead die 30 is mounted to fluidly couple to a corresponding group of three slots for a die 30 which prints three colors of ink. When these layers 70, 73a–c and 72 are stacked in the order presented, one channel is formed which connects inlet 86a to feed slots 84' and outlet 88a. An independent channel is formed which connects inlet 86b to feed slots 84" and outlet 88b. A third channel is formed which connects inlet 86c to feed slots 84'" and outlet 88c. One channel serves a first reservoir. The second channel serves a second reservoir. The third channel serves a third reservoir.

FIG. 17 shows a block diagram for a pen 200 embodying a three channel printing system which prints 3 colors of ink. The pen 200 includes three reservoirs 202, 204, 206. One reservoir is for each color ink. The ceramic substrate 32 includes a bottom layer 72 having at least three inlet openings 86a–c and at least three corresponding outlet openings 88a–c. An inlet opening 86 and a corresponding outlet opening 88 are coupled to a corresponding reservoir. In addition manifold layers 73 define 3 independent fluid paths 92', 92", 92'" for the 3 respective colors of ink. The manifold layers 73 are coupled to the top layer 70 adjacent to the printhead dies 30. The top layer 70 includes a set of 3 slots 84', 84", 84'" for each printhead die 30. One slot is coupled to a corresponding one of the three independent channels and thus to a corresponding color of ink.

Detailed descriptions of the method for mounting and interconnecting the printhead dies 30 to the substrate 32 are described in the related application of Beerling et al. cross-referenced above and included herein by reference.

Meritorious and Advantageous Effects

One advantage of the invention is that a manifold for handling multiple colors of ink is formed in a unitary printhead assembly. Another advantage is that a scalable printhead architecture is achieved in which different numbers of printhead dies are attached to a carrier substrate to define the size of the printhead. Printhead which are a page wide array of printing elements may be formed. Smaller printheads also may be formed.

Although a preferred embodiment of the invention has been illustrated and described, various alternatives, modifications and equivalents may be used. For example, although a page wide array printhead is illustrated, a smaller array scanning type printhead also may be formed. Therefore, the foregoing description should not be taken as limiting the scope of the inventions which are defined by the appended claims.

What is claimed is:

1. A fluid ejection assembly, comprising:
    a platform including a first layer having a fluid inlet and a fluid outlet defined therein, a second layer having a plurality of fluid feed slots defined therein, and at least one third layer having a fluid manifold defined therein, the at least one third layer interposed between the first layer and the second layer; and
    a plurality of fluid ejection devices each mounted on the second layer of the platform and including an array of drop ejecting elements and a fluid refill slot communicating with the array of drop ejecting elements,
    wherein the fluid refill slot of each of the fluid ejection devices communicates with at least one of the fluid feed slots of the platform, and
    wherein the fluid manifold of the platform fluidically couples each of the fluid feed slots with the fluid inlet and the fluid outlet of the platform.

2. The assembly of claim 1, wherein the fluid manifold is adapted to circulate fluid between the fluid inlet, the fluid feed slots, and the fluid outlet.

3. The assembly of claim 1, wherein the fluid manifold is adapted to circulate fluid from the fluid inlet to one of the fluid feed slots, from the one of the fluid feed slots to another of the fluid feed slots, and from the other of the fluid feed slots to the fluid outlet.

4. The assembly of claim 1, wherein the fluid manifold includes a channel communicating with at least one of the fluid inlet and the fluid outlet, and a plurality of sub-channels each communicating with the channel and one of the fluid feed slots of the platform.

5. The assembly of claim 4, wherein the fluid manifold further includes another channel communicating with an other of the fluid inlet and the fluid outlet, and another plurality of sub-channels each communicating with the other channel and one of the fluid feed slots of the platform.

6. The assembly of claim 4, wherein the fluid manifold further includes another plurality of sub-channels each communicating with one of the fluid feed slots of the platform and another of the fluid feed slots of the platform.

7. The assembly of claim 1, further comprising:
    an electrical interconnection extending through the platform, wherein each of the fluid ejection devices are electrically coupled to the electrical interconnection.

8. A fluid ejection system, comprising:
    a reservoir adapted to hold a supply of fluid therein;
    a platform including a first layer having a fluid inlet and a fluid outlet defined therein, a second layer having a plurality of fluid feed slots defined therein, and at least one third layer having a fluid manifold defined therein, the at least one third layer interposed between the first layer and the second layer, the fluid inlet and the fluid outlet communicating with the reservoir, and the fluid manifold communicating the fluid feed slots with the fluid inlet and the fluid outlet; and
    a plurality of fluid ejection devices each mounted on the second layer of the platform and including an array of drop ejecting elements and a fluid refill slot communicating with the array of drop ejecting elements,
    wherein the fluid refill slot of each of the fluid ejection devices communicates with at least one of the fluid feed slots of the platform.

9. The system of claim 8, wherein the fluid manifold is adapted to circulate a quantity of the fluid from the reservoir to each of the fluid ejection devices and from each of the fluid ejection devices back to the reservoir.

10. The system of claim 8, wherein the fluid manifold is adapted to circulate a quantity of the fluid from the reservoir to one of the fluid ejection devices, from the one of the fluid ejection devices to another of the fluid ejection devices, and from the other of the fluid ejection devices to the reservoir.

11. The system of claim 8, wherein the fluid manifold includes a channel communicating with at least one of the fluid inlet and the fluid outlet, and a plurality of sub-channels each communicating with the channel and one of the fluid feed slots of the platform.

12. The system of claim 11, wherein the fluid manifold further includes another channel communicating with an other of the fluid inlet and the fluid outlet, and another plurality of sub-channels each communicating with the other channel and one of the fluid feed slots of the platform.

13. The system of claim 11, wherein the fluid manifold further includes another plurality of sub-channels each communicating with one of the fluid feed slots of the platform and another of the fluid feed slots of the platform.

14. The system of claim 8, further comprising:

an electrical interconnection extending through the platform, wherein each of the fluid ejection devices are electrically coupled to the electrical interconnection.

15. A method of forming a fluid ejection assembly, the method comprising:

forming a platform with a fluid inlet, a fluid outlet, a plurality of fluid feed slots, and a fluid manifold therein, including interposing at least one inner layer having the fluid manifold formed therein between a first outer layer having the fluid inlet and the fluid outlet formed therein and a second outer layer having the plurality of fluid feed slots formed therein, and including fluidically coupling each of the fluid feed slots with the fluid inlet and the fluid outlet via the fluid manifold; and a plurality of fluid ejection devices on the second outer layer of the platform, including communicating each of the fluid ejection devices with at least one of the fluid feed slots.

16. The method of claim 15, wherein fluidically coupling each of the fluid feed slots with the fluid inlet and the fluid outlet includes fluidically coupling the fluid inlet with one of the fluid feed slots, fluidically coupling the one of the fluid feed slots with another of the fluid feed slots, and fluidically coupling the other of the fluid feed slots with the fluid outlet.

17. The method of claim 15, wherein fluidically coupling each of the fluid feed slots with the fluid inlet and the fluid outlet includes defining a fluid flow path between the fluid inlet, the plurality of fluid feed slots, and the fluid outlet with the fluid manifold.

* * * * *